United States Patent [19]

Edwards et al.

[11] 4,054,901
[45] Oct. 18, 1977

[54] INDEX MOUNTING UNITARY HEAT SINK APPARATUS WITH APERTURED BASE

[75] Inventors: Steven F. Edwards, Dallas; James A. Johnson, Lewisville; William D. Jordan; James D. Pritchett, both of Dallas, all of Tex.

[73] Assignee: Thermalloy, Inc., Dallas, Tex.

[21] Appl. No.: 621,665

[22] Filed: Oct. 14, 1975

[51] Int. Cl.² .................. H01L 23/02; H01L 23/28
[52] U.S. Cl. .................................. 357/81; 357/72; 165/80; 174/16 HS
[58] Field of Search .............. 357/80, 81, 72; 165/80, 165/105; 174/16 HS

[56] References Cited

U.S. PATENT DOCUMENTS

| | | | |
|---|---|---|---|
| 2,541,828 | 2/1951 | Peck | 165/80 |
| 3,047,648 | 7/1962 | Mowatt | 357/80 |
| 3,548,927 | 12/1970 | Spurling | 357/81 |
| 3,694,703 | 9/1972 | Wilens | 357/81 |
| 3,783,347 | 1/1974 | Vladik | 357/81 |
| 3,893,161 | 7/1975 | Pesak | 357/81 |

*Primary Examiner*—Andrew J. James
*Attorney, Agent, or Firm*—Jack A. Kanz

[57] ABSTRACT

Disclosed is a unitary heat sink apparatus in the form of a U-shaped body of thermally conductive material adapted for use in connection with semiconductor device packages having a thermally conductive transfer plate adjacent one major face of the device package. Typical of such device packages is the TO-220 plastic power package. One leg of the U-shaped clip urges the thermal transfer plate into intimate contact with a flat portion of the opposite leg by the spring action provided by the base of the U. An aperture in the base of the U allows the leads to extend from the heat sink. Fins are included on one leg of the heat sink and means for attaching the heat sink apparatus to printed circuit boards are also disclosed.

17 Claims, 10 Drawing Figures

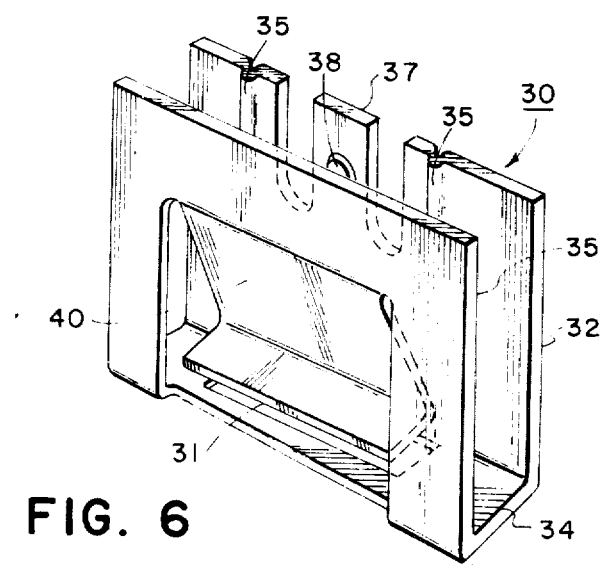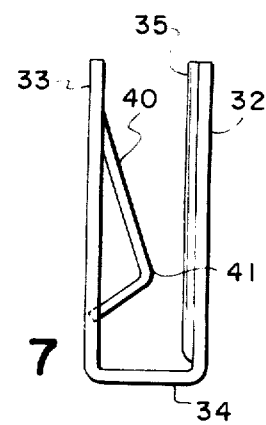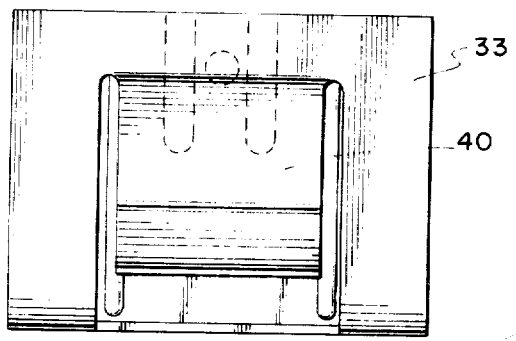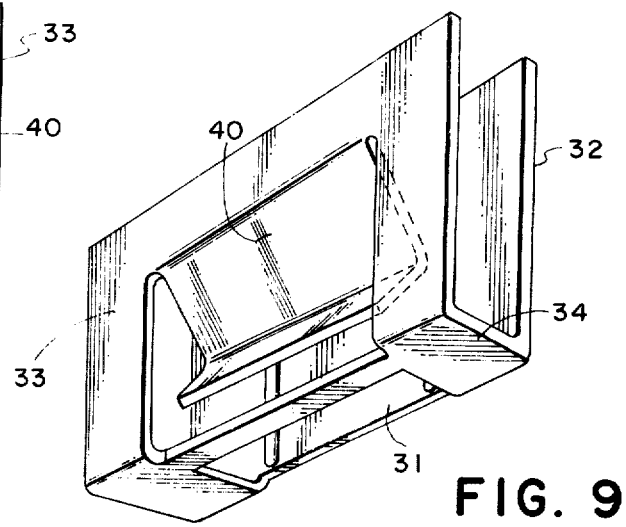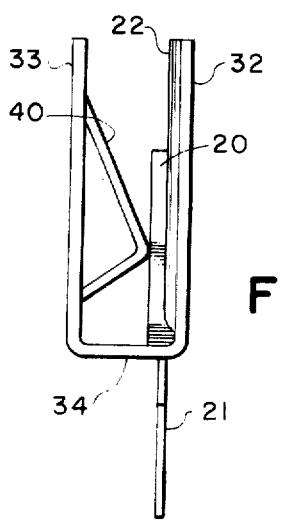

INDEX MOUNTING UNITARY HEAT SINK APPARATUS WITH APERTURED BASE

This invention relates to apparatus for dissipation of thermal energy generated by semiconductor devices. More particularly, it relates to heat sink apparatus designed to mount directly onto specialized semiconductor encasement structures and packages and dissipate thermal energy generated by such devices into the surrounding environment.

Many semiconductor devices generate heat during operation which must be dissipated to avoid damage to the semiconductor component. In some devices the heat generated is sufficiently dissipated by the enclosure, header or leads. Other devices may be mounted on heat sinks comprising bodies of thermally conductive materials such as copper, aluminum or the like which dissipate the thermal energy generated by the devices into the surrounding environment. Such heat sinks may be extruded or sheet metal bodies including heat dissipating fins or the like.

Many semiconductor encapsulation packages are provided with a thermal transfer plate integrally formed in the package to transfer thermal energy from the active semiconductor component to external thermal energy dissipating apparatus. Generally, the encapsulation package comprises a plastic body with leads extending from one end thereof and a thermal transfer plate which may be a metal tab or the like extending from the opposite end of the plastic body. Sometimes a large plate may be integrally formed in the plastic body adjacent or forming one major face thereof. The thermal transfer plate may be, as in the case of the TO-220 plastic power device case, attached to one major face of the plastic body and extend parallel thereto for a distance beyond the end of the plastic body. Such packages are designed for use in connection with external heat dissipators which are connected to the thermally conductive heat transfer plate. Accordingly, the thermal energy transfer plate or conductive tab is frequently provided with means, such as a hole or the like, for attaching the tab to a thermal energy dissipating device, the dimensions of which are determined by the use and environment of the semiconductor device.

An encapsulation case typical of the above-described package is the JEDEC TO-220 plastic power package. This and similar packages are comprised of an active semiconductor component encapsulated in a plastic body with leads extending from one end of the plastic package and a broad flat thermal transfer plate attached to or incorporated in one major face of the body parallel with the leads.

The apparatus of this invention is particularly designed for use in connection with the packages of the TO-220 device case style and other similar packages. The apparatus comprises a unitary body of thermally conductive material such as an aluminum alloy or the like which, in its preformed condition, is a substantially rectangular flat plate of sheet metal. The flat plate is first cut, by stamping or the like, to form fins as desired and to form an aperture in about the central portion thereof. The portion surrounding the aperture and a contiguous end portion thereof is then trimmed to a reduced width and the plate is then folded into a substantially U-shaped unitary member, the base of the U including the centrally located aperture and the larger leg of the U presenting a substantially flat surface opposite and spaced from the opposite leg thereof. The base of the U forms an apertured spring which urges the opposite leg toward the first leg having the substantially flat major face. Accordingly, the leads of the semiconductor encapsulation package may pass through the aperture in the base of the U-shaped clip when the semiconductor package is held between the legs of the U. The thermal transfer plate is positioned adjacent the substantially flat inner face of the first leg and the entire package urged toward the first leg by the opposite leg. In this manner the entire plastic package is physically restrained within the heat sink apparatus and the thermal transfer plate urged into intimate contact with the broad area flat surface of the first leg. The fins, if desired, may be folded to extend in a plane normal to the plane of the flat surface of the first leg and may include tabs for mounting the heat sink on a circuit board along with the semiconductor device. This configuration provides positive retention of the device within the heat sink and maximum contact area between the thermal transfer plate and the heat sink. The thermal energy conducted through the thermal transfer plate to the heat sink is dissipated by a natural or forced-air convection around the U-shaped body and/or the fins provided.

The heat sink apparatus of the invention is particularly advantageous in that the apparatus is completely unitary and no mounting hardware is required. The device simply clips onto the body of an encapsulation device and, because of the configuration of the heat sink apparatus, the thermal transfer plate is maintained in intimate contact with the flat surface of the heat sink apparatus. The apparatus thus provides maximum thermal conduction from the semiconductor device and dissipation of energy into the surrounding environment. Furthermore, no assembly tools are required.

Other advantages and features of the invention will become more readily understood when taken in connection with the appended claims and attached drawings in which:

FIG. 6 is a perspective view of an alternative embodiment of a heat sink apparatus of the invention;

FIG. 7 is a side elevational view of the apparatus of FIG. 6;

FIG. 8 is a front face elevational view of the apparatus of FIG. 6;

FIG. 9 is another perspective view of the heat sink apparatus of FIG. 6; and

FIG. 10 is a side elevational view of the combination of the heat sink apparatus of FIG. 6 and a semiconductor encapsulation device.

Figure 1:
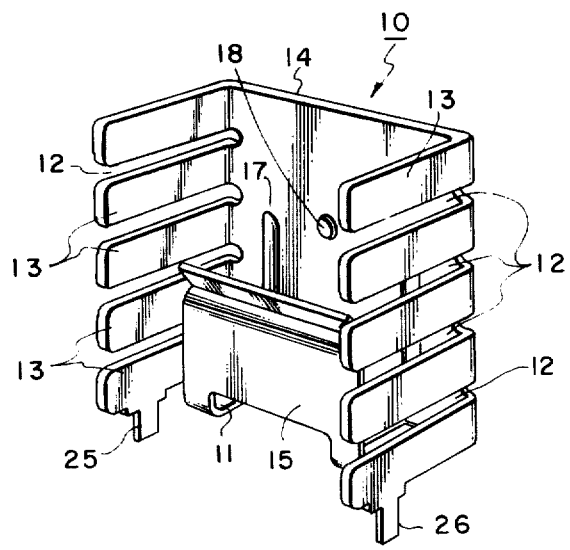
FIG. 1 is a perspective view of the embodiment of the heat sink apparatus of the invention.
Figure 2:
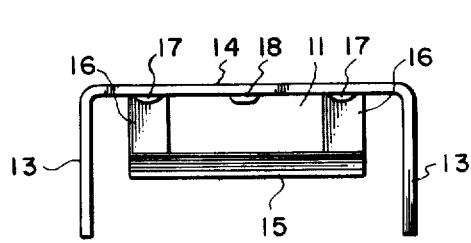
FIG. 2 is a top plan view of the heat sink apparatus of FIG. 1.

The heat sink apparatus illustrated in FIG. 1 comprises a unitary body 10 formed from a substantially rectangular, flat sheet of thermally conductive material such as an aluminum alloy or the like. The sheet metal may be plated, anodized or untreated, as desired. The device may be formed by conventional stamping and cutting operations with conventional tools. In the initial stamping operation a rectangular aperture 11 is formed near the central portion, but preferrably displaced toward one end of the body 10. Parallel slots 12 are cut in opposite side edges of one end thereof to form fins 13 and the fins 13 folded approximately 90° to the plane of the major face of the body 10. The edges of the body 10 surrounding the central aperture 11 and one contiguous end portion are trimmed to produce a tab of reduced lateral dimensions. The central portion of the body 10 and the tab of reduced width are then folded to form a U-shaped body comprising a first leg 14, a second leg 15 and a base portion 16. Since the second leg 15 is narrower than the first leg 14, the second leg 15 may be folded substantially parallel to the first leg 14 and extend between the fins 13. The base 16 is formed by the portion of the body surrounding aperture 11 so that aperture 11 is essentially confined within the base 16. It will be observed that the inner face of leg 14 is substantially flat and directly opposite the second leg 15. If desired, parallel ridges 17 may be formed in the flat surface of the inner face of the first leg 14 to define the lateral edges of the flat surface adapted for mating with the thermal transfer plate of the semiconductor device. Likewise, indexing means may be provided in the first leg 14. In the embodiment illustrated the indexing means comprises a dimple 18 substantially centrally located in the flat surface of the first leg 14 and protruding toward the second leg 15. The dimple 18 is positioned and adapted to mate with the hole in the thermal transfer plate of the semiconductor package and thereby index the heat sink apparatus for proper alignment with the encapsulation device.

In the embodiment of the apparatus illustrated in FIGS. 1 through 5, the second leg 15 includes a transverse crimp 19 providing a ridge on the internal face thereof for contacting the back side of the plastic encapsulation device body. The legs 14 and 15 comprising the U are substantially parallel and spaced apart by a distance approximately equivalent to the thickness of the encapsulation device body. Accordingly, the base 16 acts as a spring to urge the legs together and thereby hold the encapsulation device firmly between the legs 14 and 15.

Figure 5:
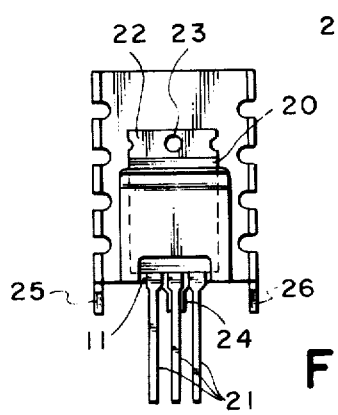
FIG. 5 is a front face elevational view of the combination of the apparatus of FIG. 1 and a semiconductor encapsulation device.

If the encapsulation device body 2 is wider than aperture 11, as shown in FIG. 5, the encapsulation device body must be inserted from the top of the heat sink apparatus and the leads 21 allowed to protrude through aperture 11 in the base. If the encapsulation package is narrower than the aperture 11, the package may be inserted from the bottom until the hole in the transfer plate mates with the indexing means 18.

In the combination illustrated in FIG. 5, the heat sink apparatus of FIG. 1 is shown in combination with a plastic power device in the TO-220 package. This package comprises a plastic encapsulation body 20 having leads 21 projecting from one end thereof. A thermal transfer plate 22 of thermally conductive material is integrally formed adjacent one major face of the body 20 and the end of the transfer plate 22 extends beyond the end of the plastic body opposite leads 21. In this particular device, a hole 23 is formed in the central portion of the plate extending past the end of the plastic body and, accordingly, the encapsulation package may be inserted between the legs 14 and 15 with the thermal transfer plate adjacent the flat face of the first leg 14 between the parallel ridges 17. As the encapsulation package is inserted between the legs, the centrally located dimple 18 is placed in registry with and mates with the hole 23 to index the device at the proper location within the heat sink clip. Due to the resilient spring action of the base portion 16, the second leg 15 urges the encapsulation device, and hence the thermal transfer plate, firmly against the flat inner face of the first leg 14. Thereby intimate broad area contact is formed between the thermal transfer plate 22 and the first leg 14.

It will be observed that, depending upon the width of aperture 11 and the particular device encapsulation case style used, the encapsulation package may be inserted from the bottom of the heat sink through aperture 11 or from the top as described above. In either case, the ridges 17 define the lateral dimensions of the flat surface and prevent the encapsulation package from moving laterally. The indexing dimple 18 mates with the indexing means such as hole 23 or the like in the thermal transfer plate to maintain the proper alignment between the semiconductor encapsulation package and the heat sink apparatus. It will be observed that the hole 23 is normally provided to permit mounting of the package on a heat sink through the use of a screw or the like. In the present invention the use of mounting screws is totally eliminated, thus eliminating the need for mounting screws and installation tools associated therewith. Accordingly, vast amounts of time, labor and expense are eliminated.

Figure 4:
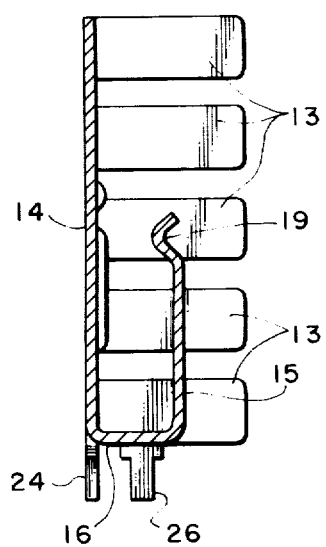
FIG. 4 is a sectional view of the apparatus of FIG. 3 taken through section lines 4—4.
Figure 3:
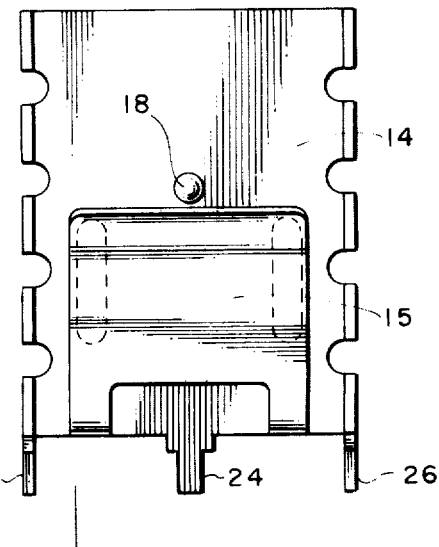
FIG. 3 is a front face elevational view of the heat sink apparatus of FIG. 1.

In many applications the leads 21 extending from the semiconductor encapsulation package are inserted within sockets or eyelets in a printed circuit board or the like. To provide further stability tabs adapted for mating with appropriate holes or eyelets in the printed circuit board may be included in the heat sink apparatus of the invention. For this purpose a tab 24 forming an extension of the flat first leg 14 may be formed to extend below the base as illustrated in FIGS. 3, 4 and 5. If desired, side tabs 25 and 26 may extend from the fins 13 nearest the base of the U-shaped clip and parallel with tab 24. Accordingly, all three tabs, 24, 25 and 26 may mate with corresponding holes or eyelets in the circuit board or other apparatus to firmly join the heat sink apparatus to the circuit board or other mounting apparatus as well as the semiconductor device itself.

An alternative embodiment of the invention is illustrated in FIGS. 6 through 10. As described with reference to the first embodiment shown, the alternative embodiment of FIGS. 6 through 10 may be formed from a substantially rectangular body of sheet metal. The body 30 may be formed by stamping and cutting with conventional tools. A substantially centrally located rectangular aperture 31 is formed in the flat plate and the plate then folded to form a U-shaped body having parallel legs 32 and 33 joined by a base member 34. Since the legs are folded to extend from the base member and the aperture 31 is substantially centrally located, aperture 31 is positioned in the central portion of the base 34. If desired, parallel ridges 35 may be formed in the first leg 32 substantially coincident with width of the aperture 31, thereby defining the flat surface of the first leg 32. Likewise, notches 36 may be formed in the upper end of the first leg 32 parallel to and between ridges 35 to define a tab 37. A raised dimple 38 is formed on the internal surface of tab 37 and adapted to mate with the indexing hole in the thermal transfer plate of the semiconductor device as hereinafter described.

As illustrated in FIG. 10 the width of the base 34 is substantially greater than the thickness of the plastic semiconductor encapsulation body 20. Accordingly a flap 40 is cut in the central portion of the second leg 33 and the flap 40 bent toward the first leg 32. The flap 40 may be crimped to present a transverse ridge 41 which contacts the back face of the plastic encapsulation device body 20.

As illustrated in FIG. 10, a semiconductor encapsulation device such as the JEDEC TO-220 or similar package may be inserted through the base aperture 31 with the thermal transfer plate 22 adjacent the inner surface of the first leg 32. The parallel ridges 35 define the lateral extremities of the flat surface and thus guide the thermal transfer plate into the heat sink apparatus. The flap 40 contacts the back side of the plastic body and urges the entire encapsulation device toward the inner surface of the first leg 32, thereby urging the thermal transfer plate 22 into intimate contact with the flat internal surface of the first leg 32. The encapsulation package is inserted into the heat sink body 30 until the hole 23 in the thermal transfer plate 22 mates with the raised dimple 38, thus locking the encapsulation package within the heat sink body 30. The leads 21 extend downwardly through the base aperture 31. The thermal transfer plate 22 is urged firmly and intimately against the broad flat surface of the first leg 32 by the spring action provided by the base 34 and the flap 40.

Thermal energy conducted from the semiconductor encapsulation body through the thermal transfer plate 22 is rapidly transferred to the heat sink body 10 or 30 by the broad area intimate contact between the heat transfer plate 22 and the first leg of the heat sink apparatus. Air may circulate between the opposed legs and around the fins 13 by natural convection or by forced means to aid in the dissipation of thermal energy.

It should be understood that the geometric designs disclosed herein are not to be considered limitative of the invention and that other geometric designs may be utilized to perform the functions described herein and achieve similar results. While various other geometric designs will lend themselves equally to the function required, the apparatus described is readily formed with commercially available tools.

It will be observed that the entire heat sink apparatus is of unitary design which may be formed by simple stamping operation. Assembly of the combination of the invention is accomplished by merely inserting the semiconductor package between the opposed legs of the U-shaped body with the heat transfer plate adjacent the first leg. The combination may be assembled by either inserting the device package through the base aperture or from the top of the heat sink apparatus. Thus, installation hardware is completely eliminated. Furthermore, time necessary to attach the heat sinks to the semiconductor device is greatly reduced and installation tools are not required. The efficiency of the heat sink will be partially dependent, of course, upon the type of material used, the size and configuration of the heat sink body, the surrounding environment, the thermal energy generated by the device and the area of contact between the heat sink and the thermal transfer plate.

While the invention has been described with particular reference to apparatus formed from a rectangular body of aluminum alloy, it will be apparent to those skilled in the art that the body need not be of rectangular dimensions. The principles of the invention will be served by any unitary body which may be formed into a U-shaped body with opposed legs joined by an apertured base portion with means to urge the thermal transfer plate of the semiconductor encapsulation body into intimate contact with the interior surface of one of the legs. Likewise, although the invention has been described with reference to use of aluminum alloy as the heat sink body, other materials may be used with similar results. It should also be appreciated that although the invention has been described with particular reference to use in connection with the TO-220 plastic power package, the invention is equally suitable for use with other packages of related design.

It is to be understood that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed is:

1. Unitary heat sink apparatus comprising a substantially U-shaped body of thermally conductive material, one leg of said U-shaped body providing a relatively broad area flat surface adapted to mate with the thermal transfer plate of a semiconductor encapsulation device and including indexing means protruding from said flat surface of said one leg for mating with indexing means provided in said encapsulation device, the opposite leg of said U-shaped body providing means for urging the thermal transfer plate of said encapsulation device into intimate contact with said one leg, and the base of said U-shaped body providing spring means for urging said opposite leg of said U-shaped body toward said one leg of said U-shaped body, said base further having an aperture therein for permitting the leads extending from said encapsulation device to extend therethrough.

2. Apparatus as defined in claim 2 wherein said indexing means on said flat surface is a raised dimple adapted to mate with a hole in the heat transfer plate of said encapsulation device.

3. Apparatus as defined in claim 1 wherein said one leg is wider than said opposite leg and includes fins extending from the edges thereof.

4. Apparatus as defined in claim 3 wherein said fins extend in a direction substantially normal to the plane of said flat surface.

5. Apparatus as defined in claim 1 including a first tab extending from said one leg substantially in the plane of said flat surface and extending past said base.

6. Apparatus as defined in claim 4 including a first tab extending from said one leg substantially in the plane of said flat surface and extending past said base, and further including fins extending from the edges of said one leg at the end thereof nearest said base and including a tab extending from each of such fins and parallel with said first tab.

7. Apparatus as defined in claim 1 including parallel ridges in said one leg defining the edges of said flat surface.

8. Apparatus as defined in claim 1 including parallel ridges in said first leg defining the lateral edges of said flat surface, and having parallel notches in said flat surface between and parallel with said ridges, said notches extending from the end of said one leg opposite said base toward said base, and wherein said indexing means is a raised dimple on the portion of said flat surface between said notches.

9. Apparatus as defined in claim 1 wherein said means for urging the thermal transfer plate of an encapsulation device into intimate contact with said one leg is a tab extending from said opposite leg toward said one leg.

10. The combination comprising:
 a. a semiconductor encapsulation package including a plastic body having leads extending from one end thereof and a thermal transfer plate adjacent and forming one major face of said body and having indexing means in said thermal transfer plate, and
 b. a unitary heat sink comprising a substantially U-shaped body of thermally conductive material, the inner surface of one leg of said U-shaped body mating with said thermal transfer plate and including indexing means protruding from said inner surface of said one leg and mating with said indexing means in said thermal transfer plate, the opposite leg of said U-shaped body providing means for urging said thermal transfer plate into intimate contact with said one leg; the base of said U-shaped body providing spring means for urging said opposite leg toward said one leg, said base further having an aperture therein; and said leads extending through said aperture.

11. The combination defined in claim 10 wherein said one leg is wider than said opposite leg and includes fins extending from the edges thereof.

12. The combination defined in claim 11 wherein said fins extend in a direction substantially normal to said first leg.

13. The combination defined in claim 10 including a first tab extending from said one leg substantially in the plane of said first leg and extending beyond said base.

14. The combination defined in claim 12 including a first tab extending from said one leg substantially in the plane of said one leg and extending parallel with said leads, and further including a fin tab extending from each of said fins nearest the base, said fin tabs extending beyond said base and parallel with said leads.

15. The combination defined in claim 10 including parallel ridges on the inner face of said one leg parallel with the edges of said thermal transfer plate.

16. The combination defined in claim 10 wherein the base of said U-shaped body is substantially wider than the thickness of said plastic body, and including flap means depending from said opposite leg for urging said plastic body toward said first leg.

17. The combination defined in claim 16 wherein said one leg and said opposite leg are of substantially the same width.

* * * * *